United States Patent
Sato et al.

(10) Patent No.: US 9,426,896 B2
(45) Date of Patent: Aug. 23, 2016

(54) INSULATING RESIN FILM, BONDED STRUCTURE USING INSULATING RESIN FILM, AND PRODUCTION METHOD OF BONDED STRUCTURE

(71) Applicant: Dexerials Corporation, Tokyo (JP)

(72) Inventors: Daisuke Sato, Tochigi (JP); Junichi Nishimura, Tochigi (JP); Ryosuke Odaka, Tochigi (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 14/278,810

(22) Filed: May 15, 2014

(65) Prior Publication Data

US 2014/0251537 A1    Sep. 11, 2014

Related U.S. Application Data

(60) Division of application No. 13/309,855, filed on Dec. 2, 2011, which is a continuation of application No. PCT/JP2010/058519, filed on May 20, 2010.

(30) Foreign Application Priority Data

Jun. 10, 2009 (JP) ................................. 2009-139483
Mar. 2, 2010 (JP) ................................. 2010-045247

(51) Int. Cl.
  *H05K 3/30*    (2006.01)
  *C09J 7/02*    (2006.01)
  (Continued)

(52) U.S. Cl.
  CPC ............... *H05K 3/30* (2013.01); *C09J 7/0203* (2013.01); *C09J 163/00* (2013.01); *H01L 24/29* (2013.01);
  (Continued)

(58) Field of Classification Search
  CPC ...... H05K 3/305; H05K 3/323; H01L 24/29; H01L 24/32; C09J 7/00; C09J 5/06; B29C 65/4835; B29C 65/5021; B32B 2037/1253
  See application file for complete search history.

(56) References Cited

U.S. PATENT DOCUMENTS 6,020,059 A    2/2000   Yamada et al.
6,566,422 B1   5/2003   Yagi et al.
(Continued)

FOREIGN PATENT DOCUMENTS

JP    10-289969    10/1998
JP    2000-178511   6/2000
(Continued)

OTHER PUBLICATIONS

Korean Office Action dated May 16, 2016 issued for corresponding Korean application with English translation.

*Primary Examiner* — John Goff
(74) *Attorney, Agent, or Firm* — Carmody Torrance Sandak & Hennessey LLP

(57) ABSTRACT

To provide an insulating resin film, which contains: a first adhesive layer; and a second adhesive layer, wherein the insulating resin film is configured to bond a substrate and an electronic part together, and the first adhesive layer is provided at a side of the substrate and the second adhesive layer is provided at a side of the electronic part, wherein the first adhesive layer and the second adhesive layer each contain inorganic filler, wherein the second adhesive layer has a DSC exothermic peak temperature that is higher than a DSC exothermic peak temperature of the first adhesive layer, and wherein a thickness of the first adhesive layer is 50% to 90% of a total thickness of the insulating resin film.

5 Claims, 2 Drawing Sheets

(51) Int. Cl.
  *C09J 163/00* (2006.01)
  *H01L 23/00* (2006.01)
  *C08K 3/00* (2006.01)

(52) U.S. Cl.
  CPC ............... *H01L 24/32* (2013.01); *H05K 3/305* (2013.01); *C08K 3/0008* (2013.01); *C09J 2201/134* (2013.01); *C09J 2205/102* (2013.01); *C09J 2463/00* (2013.01); *H01L 2224/29* (2013.01); *H01L 2224/2919* (2013.01); *H01L 2224/2929* (2013.01); *H01L 2224/29101* (2013.01); *H01L 2224/29366* (2013.01); *H01L 2224/29386* (2013.01); *H01L 2224/83101* (2013.01); *H01L 2224/83194* (2013.01); *H01L 2924/00013* (2013.01); *H01L 2924/0102* (2013.01); *H01L 2924/014* (2013.01); *H01L 2924/01005* (2013.01); *H01L 2924/01006* (2013.01); *H01L 2924/01013* (2013.01); *H01L 2924/01033* (2013.01); *H01L 2924/01045* (2013.01); *H01L 2924/01079* (2013.01); *H01L 2924/01082* (2013.01); *H01L 2924/0665* (2013.01); *H01L 2924/07802* (2013.01); *H01L 2924/14* (2013.01); *H01L 2924/15788* (2013.01); *H05K 2201/0195* (2013.01); *H05K 2201/0209* (2013.01); *Y02P 70/613* (2015.11); *Y10T 428/28* (2015.01); *Y10T 428/2848* (2015.01)

(56) References Cited

U.S. PATENT DOCUMENTS

| | | | |
|---|---|---|---|
| 2003/0145949 | A1 | 8/2003 | Tanaka et al. |
| 2007/0054114 | A1 | 3/2007 | Kumakura |
| 2007/0137887 | A1* | 6/2007 | Watanabe et al. ............ 174/256 |
| 2010/0116533 | A1 | 5/2010 | Ishimatsu et al. |
| 2011/0247867 | A1 | 10/2011 | Watanabe et al. |

FOREIGN PATENT DOCUMENTS

| | | |
|---|---|---|
| JP | 2001-160568 | 6/2001 |
| JP | 2004-342663 | 12/2004 |
| JP | 2007-131649 | 5/2007 |
| JP | 2007-182062 | 7/2007 |
| KR | 10-2001-0106440 | 11/2001 |
| KR | 10-2002-0034084 | 5/2002 |
| TW | 200908027 | 2/2009 |
| WO | 2009/013968 | 1/2009 |

* cited by examiner

INSULATING RESIN FILM, BONDED STRUCTURE USING INSULATING RESIN FILM, AND PRODUCTION METHOD OF BONDED STRUCTURE

CROSS-REFERENCE TO RELATED APPLICATION

This is a continuation of Application No. PCT/JP2010/058519, filed on May 20, 2010.

BACKGROUND OF THE INVENTION

1. Field of the Invention

The present invention relates to an insulating resin film used for joining an electronic part and a substrate, a bonded structure using the insulating resin film, and a production method of the bonded structure.

2. Description of the Related Art

As one of methods for bonding an electronic part (e.g., an IC chip), and a substrate (e.g., a glass epoxy substrate (PCB)) together, flip chip bonding technology has been known. In the flip chip bonding technology, bumps of the IC chip are arranged to face wirings of the PCB, and the bumps and wirings are electrically connected by bringing the bumps and wirings into contact with each other directly, or via conductive particles, as well as heating and pressing. For the connection via the conductive particles, an anisotropic conductive film (ACF) is used. As the ACF, a film having an epoxy resin-based insulating adhesive layer in which conductive particles are dispersed is generally used. For example, if the ACF is provided between the IC chip and the substrate, and heat and pressure is applied thereto, the conductive particles are sandwiched and crushed by the bumps of the IC chip and the electrode of the substrate, to thereby realize electric connection between the bumps of the IC chip and the electrode.

Recently, along with the trends of downsized and high performance electronic devices, semiconductor devices have been highly integrated. As a result, a space between bumps of an IC chip has been getting narrowed, and an area of each bump has been getting smaller. However, a limit of diameters of the conductive particles to be downsized is approximately 2 μm. As a connection method in a finer region, therefore, a non conductive film (NCF) bonding method has been noted. The NCF bonding is a method where the bumps of the IC chip and the wirings of the substrate are directly bonded via a non conductive film (NCF). In the NCF bonding, stud bumps are used as bumps of the IC chip, and the IC chip and the substrate are directly bonded by crushing the stud bumps with the substrate during pressure bonding of the IC chip and the substrate.

As conventional NCF, a single-layer structure products having high glass transition temperature are in the main stream and those having the glass transition temperature of 150° C. or higher have been used for securing connection reliability. If the IC chip and the substrate are bonded using such NCF by performing heating and compressing, the resultant has excellent connection reliability (connection resistance), however, adherence (die shear strength) between the IC chip and the substrate is poor in a pressure cooker test (PCT).

Conversely, use of the low curing shrinking and highly adhering NCF having the glass transition temperature of lower than 150° C. does not give a degraded adherence in the PCT, but forming voids in the NCF after bonding the IC chip and the substrate because of a slow curing speed thereof.

Contrary to the advantage of the NCF bonding using the stud bumps that it is suited for a fine pitch application, the NCF bonding have problems that the IC chip and the substrate are easily separated from each other because of defects, such as voids formed in the NCF, and floating of bumps.

For example, Japanese Patent Application Laid-Open (JP-A) No. 2001-160568 discloses a bonding material containing thermoset resin, and inorganic filler, and discloses that use of such a material gives excellent reliability after PCT. However, this bonding material is a single material of a single layer structure, and there is no description about whether or not die shear strength is degraded after the PCT.

Moreover, JP-A No. 2000-178511 discloses a method for bonding an IC and a wiring board with an epoxy resin having a laminate structure. In this method, the connection reliability of the bonded structure is improved after aging by giving the epoxy resin a laminate structure, and a difference in melt viscosity. However, it is not disclosed about maintaining die shear strength thereof after the PCT.

Furthermore, JP-A No. 10-289969 discloses a method where a joint ball is used as an electrode of an IC chip, and the IC chip and a substrate are bonded with a two-layer structure NCF. Although the NCF has a two-layer structure in this method, the layer structure is merely formed of a combination of a layer containing inorganic filler and a layer without inorganic filler, the layers using the identical epoxy resin compositions. Therefore, this method cannot prevent formation of voids, or improve adherence between the IC chip and the substrate. Moreover, for the connection between the IC chip and the substrate, joint balls are used. Therefore, no solution for a problem such as floating of bumps, caused in the case where stud bumps are used, is provided.

BRIEF SUMMARY OF THE INVENTION

The present invention aims to provide an insulating resin film capable of preventing occurrences of voids, providing sufficient adherence to an electronic part and to a substrate, and having excellent connection reliability, as well as providing a bonded structure using the insulating resin film, and having excellent connection reliability, and providing a method for efficiently producing the bonded structure.

The means for solving the aforementioned problems are as follows;

<1> An insulating resin film, containing;
a first adhesive layer; and
a second adhesive layer,
wherein the insulating resin film is configured to bond a substrate and an electronic part together, and the first adhesive layer is provided at a side of the substrate and the second adhesive layer is provided at a side of the electronic part,
wherein the first adhesive layer and the second adhesive layer each contain inorganic filler,
wherein the second adhesive layer has a DSC exothermic peak temperature that is higher than a DSC exothermic peak temperature of the first adhesive layer, and
wherein the first adhesive layer has a thickness that is 50% to 90% of a total thickness of the insulating resin film.

<2> The insulating resin film according to <1>, further containing an intermediate layer provided between the first adhesive layer and the second adhesive layer.

<3> The insulating resin film according to any of <1> or <2>, wherein the first adhesive layer has a glass transition temperature that is higher than a glass transition temperature of the second adhesive layer.

<4> The insulating resin film according to any one of <1> to <3>, wherein a difference between the DSC exothermic peak temperature of the first adhesive layer and the DSC exothermic peak temperature of the second adhesive layer is 7° C. to 10° C.

<5> The insulating resin film according to any one of <1> to <4>, wherein a difference in linear expansion coefficient α1 between the first adhesive layer and the second adhesive layer is smaller than 10 in an absolute value, and a difference in linear expansion coefficient α2 between the first adhesive layer and the second adhesive layer is smaller than 30 in an absolute value.

<6> A bonded structure, containing:
a substrate containing an electrode;
an electronic part containing stud bumps; and
the insulating resin film as defined in any one of <1> to <5>,
wherein the substrate and the electronic part are bonded together with the insulating resin film, and the electrode of the substrate and the stud bumps of the electronic part are electrically connected.

<7> A method for producing a bonded structure, comprising:
arranging a substrate containing an electrode, an electronic part containing stud bumps, and the insulating resin film as defined in any one of <1> to <5> so that the electrode of the substrate and the stud bumps of the electronic parts are faced each other via the insulating resin film, and heating and pressing the substrate and the electronic part to thereby bond the substrate and the electronic part together.

The present invention can solve the various problems in the art, and can provide an insulating resin film capable of preventing occurrences of voids, providing sufficiently tight coupling between an electronic part and a substrate, and having excellent connection reliability, as well as providing a bonded structure using the insulating resin film, and having excellent connection reliability, and providing a method for efficiently producing the bonded structure.

Figure 1:
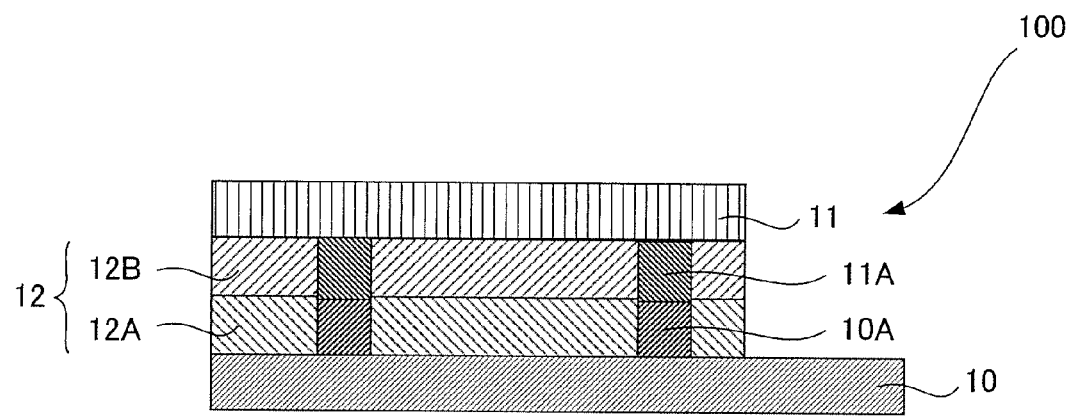
FIG. 1 is a schematic diagram illustrating one example of the bonded structure of the present invention.

DETAILED DESCRIPTION OF THE INVENTION (Insulating Resin Film)

The insulating resin film of the present invention is an insulating resin film for bonding a substrate and an electronic part together, and contains at least a first adhesive layer and a second adhesive layer, optionally further contains an intermediate layer between the first adhesive layer and the second adhesive layer, and may further contain appropriately selected other layers, if necessary.

The first adhesive layer is provided at a side of the substrate, and the second adhesive layer is provided at a side of the electronic part.

The first adhesive layer and the second adhesive layer both contain at least inorganic filler. Use of the inorganic filler improves dimensional stability of the resulting insulating resin film.

The inorganic filler is appropriately selected depending on the intended purpose without any restriction, and examples thereof include silica, calcium carbonate, titanium, alumina, and silicon nitride. These may be used independently, or in combination.

An amount of the inorganic filler contained in each of the first adhesive layer and the second adhesive layer is appropriately selected depending on the intended purpose without any restriction, but it is preferably 40% by mass to 60% by mass.

When the amount thereof is smaller than 40% by mass, dimensional stability may be low, which may result in poor connection reliability. When the amount thereof is larger than 60% by mass, it may be difficult to maintain the film state.

Moreover, the DSC exothermic peak temperature of the second adhesive layer is higher than the DSC exothermic peak temperature of the first adhesive layer. When an electronic part and a substrate are bonded with the insulating resin film having such DSC exothermic peak temperatures by applying heat and pressure, the first adhesive layer provided at the side of the substrate and the second adhesive layer provided at the side of the electronic part are respectively cured at different speeds, resulting in different cure shrinkages. Moreover, since the curing process of the second adhesive layer progresses more slowly compared to the curing of the first adhesive layer, the second adhesive layer can be cured while removing the voids remained between the second adhesive layer and the electronic part, such as an IC chip (LSI) during the pressure bonding, and therefore, excellent adherence (die shear strength) can be maintained even after a pressure cooker test (PCT).

Here, the DSC exothermic peak temperature means a temperature of an exothermic peak measured by differential scanning calorimetry (DSC).

A DSC exothermic peak temperature of the first adhesive layer is appropriately selected depending on the intended purpose without any restriction, provided that it is lower than the DSC exothermic peak temperature of the second adhesive layer. The DSC exothermic peak temperature of the first adhesive layer is preferably 118° C. or lower.

When the DSC exothermic peak temperature of the first adhesive layer is higher than 118° C., the reactivity of the resulting insulating resin layer is low, and therefore it may take a long time to bond a substrate and an electronic part. Moreover, with the first adhesive layer having such exothermic peak temperature, the first adhesive layer may flow into a connecting part in the excessive amount, which may lead to connection failures.

A DSC exothermic peak temperature of the second adhesive layer is appropriately selected depending on the intended purpose without any restriction, provided that it is higher than the DSC exothermic peak temperature of the first adhesive layer. The DSC exothermic peak temperature of the second adhesive layer is preferably 125° C. or higher.

When the DSC exothermic peak temperature of the second adhesive layer is lower than 125° C., the second adhesive layer is not sufficiently removed at the time of bonding, which may result in poor connection reliability.

Further, a thickness of the first adhesive layer is 50% to 90% of the total thickness. The first adhesive layer having this range of the thickness give the resulting insulating resin film an excellent maintainability of the die shear strength after the PCT.

When the thickness of the first adhesive layer provided at the side of the substrate is less than 50% of the total thickness, voids may be remained in the resulting bonded structure, leading to low connection reliability of the bonded structure after the PCT. When the thickness thereof is more than 90%, the second adhesive layer is not sufficiently remained between the substrate and the electronic part, which may lead to low connection reliability of the resulting bonded structure after the PCT. When thicknesses of the first and second adhesive layers are each thinner than 10 µm, the production may not be performed with desirable reproducibility.

A total thickness of the first adhesive layer and the second adhesive layer is appropriately selected depending on the intended purpose without any restriction, but it is preferably 10 µm to 80 µm, more preferably 20 µm to 60 µm. In the case where an intermediate layer is provided between the first adhesive layer and the second adhesive layer, the total thickness of the first adhesive layer, the second adhesive layer, and the intermediate layer still falls into the same numerical range mentioned above.

In the insulating resin film of the present invention, the first adhesive layer and the second adhesive layer further satisfy the following relationship, i.e, a glass transition temperature of the first adhesive layer preferably being higher than a glass transition temperature of the second adhesive layer. When the first adhesive layer and the second adhesive layer satisfy the relationship mentioned above, it is advantageous because residual stress at the interface with an IC chip (LSI) can be reduced.

The glass transition temperatures of the first adhesive layer and second adhesive layer are appropriately selected depending on the intended purpose without any restriction, provided that the aforementioned relationship is satisfied. The glass transition temperature of the first adhesive layer is preferably 150° C. or higher, more preferably 155° C. to 190° C.

When the glass transition temperature of the first adhesive layer is lower than 150° C., the resulting insulating resin film may have poor connection reliability in environments of practical use.

The glass transition temperature of the second adhesive layer is preferably lower than 150° C.

When the glass transition temperature of the second adhesive layer is 150° C. or higher, the residual stress at an interface with an IC chip (LSI) may not be reduced even though the insulating resin film has a two-layer structure.

Moreover, a glass transition temperature of the insulating resin film of the present invention, in the state where the first adhesive layer and the second adhesive layer are laminated, is appropriately selected depending on the intended purpose without any restriction, but it is preferably 148° C. to 155° C.

When the glass transition temperature of the insulating resin film is lower than 148° C., the resulting insulating resin film may have poor connection reliability in environments of practical use. When the glass transition temperature thereof is higher than 155° C., the residual stress at an interface with an IC chip (LSI) may not be reduced.

Moreover, a difference between the DSC exothermic peak temperature of the first adhesive layer and the DSC exothermic peak temperature of the second adhesive layer is appropriately selected depending on the intended purpose without any restriction, but it is preferably 7° C. to 10° C.

When the difference in the DSC exothermic peak temperature is less than 7° C., it may not be able to selectively flow the second adhesive layer during bonding. When the difference is more than 10° C., it may not be able to selectively cure the second adhesive layer, which may cause defects.

Furthermore, the DSC exothermic peak temperature of the insulating resin film of the present invention in the state where the first adhesive layer and the second adhesive layer are laminated is appropriately selected depending on the intended purpose without any restriction, but it is preferably 118° C. to 125° C.

When the DSC exothermic peak temperature of the insulating resin film is lower than 118° C., the curing speed is excessively fast (low temperature curing is accelerated), and therefore the resin cannot be sufficiently removed, which may cause defects. When the DSC exothermic peak temperature thereof is higher than 125° C., the resin may not be sufficiently cured during bonding, which may result in defects.

Moreover, a difference in the linear expansion coefficient $\alpha 1$ between the first adhesive layer and the second adhesive layer is preferably smaller than 10 in an absolute value, and a difference in the linear expansion coefficient $\alpha 2$ between the first adhesive layer and the second adhesive layer is preferably smaller than 30 in an absolute value. When these relationships are satisfied, it is advantageous because the resulting insulating resin film can maintain dimensional stability.

The linear expansion coefficients $\alpha 1$ and $\alpha 2$ of the first adhesive layer and second adhesive layer are appropriately selected depending on the intended purpose without any restriction, provided that the aforementioned relationships are satisfied. The linear expansion coefficient $\alpha 1$ of the first adhesive layer and second adhesive layer are preferably in the range of 21 ppm/° C. to 40 ppm/° C., and the linear expansion coefficient $\alpha 2$ thereof is preferably in the range of 100 ppm/° C. to 140 ppm/° C., as the resulting insulating resin film can maintain connection reliability.

—First Adhesive Layer—

The first adhesive layer is arranged at a side of the substrate.

The substrate is appropriately selected depending on the intended purpose without any restriction, and examples thereof include a glass epoxy substrate, a rigid substrate, and a flexible wiring board.

The first adhesive layer contains at least a first resin and the inorganic filler, preferably further contains a coupling agent, and may further contain appropriately selected other substances, if necessary.

The first resin is appropriately selected depending on the intended purpose without any restriction, provided that it has a different curing speed to that of a second resin contained in a second adhesive layer, which will be described later. Examples of the first resin include an epoxy resin, an organic resin that will be a high polymer component (a film component), and a stress relaxant.

Examples of the epoxy resin preferably include a naphthalene-based epoxy resin.

Examples of the organic resin that will be a high polymer component (a film component) preferably include a phenoxy resin.

Examples of the stress relaxant preferably include polybutandiene rubber (PB), acryl rubber, acrylonitrile rubber, EVA, and a rubber-modified epoxy resin.

The first resin may be used independently, or in combination.

An amount of the first resin in the first adhesive layer is appropriately selected depending on the intended purpose without any restriction, but it is preferably 30% by mass to 60% by mass.

When the amount of the first resin is smaller than 30% by mass, the resulting first adhesive layer may have poor function as a thermoset adhesive. When the amount thereof is larger than 60% by mass, it may be difficult to provide the first adhesive layer as an adhesive film.

Moreover, the first resin is preferably used in combination with a curing agent. By using the first resin in combination with the curing agent, reflow resistance can be improved.

The curing agent used with the first resin is appropriately selected depending on the intended purpose without any restriction. For example, imidazoles such as 2-ethyl-4-methyl imidazole, and other organic amines can be used as an anionic curing agent. Moreover, a sulfonium salt, an onium salt, and an aluminum chelating agent can be used as a cationic curing agent. Furthermore, a latent curing agent, in which any of the aforementioned curing agents is encapsulated with an insulating resin coating, is also suitably used.

An amount of the curing agent in the first adhesive layer is appropriately selected depending on the intended purpose without any restriction, but it is preferably 5% by mass to 15% by mass.

Use of the coupling agent can improve adherence between IC and a glass epoxy substrate.

The coupling agent is appropriately selected depending on the intended purpose without any restriction, and examples thereof include a silane coupling agent, such as alkoxy silane containing an epoxy group, and alkoxy silane containing an acryl group.

An amount of the coupling agent in the first adhesive layer is appropriately selected depending on the intended purpose without any restriction, but it is preferably 0.1% by mass to 5% by mass.

When the amount of the coupling agent is smaller than 0.1% by mass, the bonding strength may not be improved. When the amount thereof is larger than 5% by mass, voids may occur during the bonding.

The aforementioned other substances are appropriately selected depending on the intended purpose without any restriction.

The first adhesive layer can be formed, for example, by preparing a first adhesive layer coating liquid containing a first resin, inorganic filler, a curing agent, a stress relaxant, a coupling agent, and optionally appropriately selected other substances, and applying the first adhesive layer coating liquid onto a base. The application of the first adhesive layer coating liquid (i.e., coating) is appropriately selected depending on the intended purpose without any restriction, and examples thereof include bar coating, spin coating, blade coating, and dip coating.

—Second Adhesive Layer—

The second adhesive layer is arranged at the side of the electronic part.

The electronic part is appropriately selected depending on the intended purpose without any restriction, and examples thereof include a semiconductor chip, a resistance element, a chip-on-board (COB) device, a chip-on-film (COF) device, and a tape automated bonding (TAB) device.

The second adhesive layer contains at least a second resin and inorganic filler, preferably further contains a coupling agent, and may further contain appropriately selected other components, if necessary.

The second resin is appropriately selected depending on the intended purpose without any restriction, provided that it has a different curing speed to that of the first resin of the first adhesive layer. Examples of the second resin preferably include an epoxy resin, and a thermoplastic resin.

The epoxy resin preferably includes, for example, a bisphenol A epoxy resin, a bisphenol F epoxy resin, and a phenol novolak epoxy resin.

The thermoplastic resin preferably includes resins similar to the first resin.

As the second resin, the aforementioned resins may be used independently or in combination.

An amount of the second resin in the second adhesive layer is appropriately selected depending on the intended purpose without any restriction, but it is preferably 30% by mass to 60% by mass.

When the amount of the second resin is smaller than 30% by mass, the second adhesive layer may have poor properties as a thermoset adhesive. When the amount thereof is larger than 60% by mass, it may be difficult to provide the second adhesive layer as an adhesive film.

Moreover, the second resin is preferably used in combination with a curing agent. The curing agent is preferably a curing agent that can also be used with the first resin.

Further, the second adhesive layer preferably contains a coupling agent, and an amount of the coupling agent for use is the same as the amount of the coupling agent used in the first adhesive layer.

The aforementioned other components are appropriately selected depending on the intended purpose without any restriction.

The second adhesive layer can be formed, for example, by preparing a second adhesive layer coating liquid containing the second resin, inorganic filler, coupling agent, curing agent, and optionally appropriately selected other components, and applying the second layer coating liquid onto the first adhesive layer. As a result, an insulating resin film containing the first adhesive layer and the second adhesive layer is obtained.

Alternatively, the second adhesive layer is formed by applying the second adhesive layer coating liquid onto a release film. The obtained second adhesive layer is laminated with the previously prepared first adhesive layer by laminating, to thereby obtain an insulating resin film containing the first adhesive layer and the second adhesive layer.

The application method (i.e. coating method) of the second adhesive layer coating liquid is appropriately selected depending on the intended purpose without any restriction, and examples thereof include bar coating, spin coating, blade coating, and dip coating.

—Intermediate Layer—

The intermediate layer is preferably provided between the first adhesive layer and the second adhesive layer.

The intermediate layer contains at least a third resin and the inorganic filler, preferably further contains a coupling agent, and may further contain appropriately selected other substances, if necessary.

As for the third resin, inorganic filler, and coupling agent, those used in the second adhesive layer can be used, and amounts of these materials are also the same as the amounts of the respective materials used in the second adhesive layer. Moreover, the intermediate layer can be prepared in the same manner as in the second adhesive layer.

A thickness of the intermediate layer is appropriately selected depending on the intended purpose without any restriction, but it is preferably 10% to 90% of the thickness of the second adhesive layer.

—Other Layers—

Other layers are appropriately selected depending on the intended purpose without any restriction, and examples thereof include a release layer.

A shape, structure, size, thickness, material, and the like of the release layer are appropriately selected depending on the intended purpose without any restriction. The release layer is preferably a layer having excellent releasing ability, or heat resistance. Examples thereof include a release polyethylene terephthalate (PET) sheet on which a release agent such as silicone has been coated. Moreover, a polytetrafluoroethylene (PTFE) may also be used as the release layer.

The insulating resin film of the present invention prevents formations of voids, and provide sufficient adherence to the electronic part and to the substrate to give excellent connection reliability to a resulting bonded structure, and therefore the insulating resin film can be suitably used for bonding various electronic parts to a substrate, especially suitable as a non conductive film (NCF) for chip on board (COB) bonding.

(Bonded Structure)

The bonded structure of the present invention contains a substrate containing an electrode, an electronic part containing stud bumps, and the insulating resin film of the present invention, wherein the substrate and the electronic part are bonded together with the insulating resin film, and the electrode of the substrate and the stud bumps of the electronic part are electrically connected.

Note that, the details of the insulating resin film of the present invention, the substrate, and the electronic part are as described earlier.

Here, one example of the bonded structure using the insulating resin film of the present invention will be explained with reference to drawings. For example, as illustrated in FIG. 1, the bonded structure 100 has a glass epoxy substrate 10 as a substrate, an electronic part (an IC chip) 11, and an insulating resin film 12. The insulating resin film 12 is provided so that the first adhesive layer 12A of the insulating resin film 12 is arranged at a side of the substrate 10, and the second adhesive layer 12B of the insulating resin film 12 is arranged at a side of the IC chip 11. By conducting electricity between the stud bump 11A of the IC chip 11 and the electrode 10A of the glass epoxy substrate 10, the glass epoxy substrate 10 and the IC chip 11 are electrically connected.

In the bonded structure of the present invention, the insulating resin film of the present invention has a layer structure including at least two adhesive layers each having different curing speeds, so that the cure shrinkage of the second adhesive layer is improved.

Since a difference in linear expansion coefficient between the first adhesive layer and the second adhesive layer is small, the stud bumps are prevented from floating during a reflow treatment, and as a result the electronic part is prevented from pealing off from the bonded structure. Moreover, as the cure shrinkage of the second adhesive layer is improved, the bonded structure secures an excellent adherence (die shear strength) even after the PCT, which lead to excellent connection reliability.

(Method for Producing Bonded Structure)

The method for producing a bonded structure of the present invention contains at least a bonding step, and may further contain appropriately selected other steps, if necessary.

<Bonding Step>

The bonding step is arranging a substrate containing an electrode, an electronic part containing stud bumps, and the insulating resin film of the present invention so that the electrode of the substrate and the stud bumps of the electronic parts are faced to each other via the insulating resin film, and heating and pressing the substrate and the electronic part to thereby bond the substrate and the electronic part together.

Note that, the details of the substrate, electronic part, and insulating resin film are as described earlier.

The heating is performed for the contact duration of about 20 seconds, at the heating temperature of 170° C. to 200° C.

The pressing is performed differently depending on an electronic part for use. In the case of an IC chip, the pressing is performed at trust of 20 g per bump to 200 g per bump, for 3 seconds to 30 seconds.

The bonding may be performed with ultrasonic waves and heat.

In accordance with the step as mentioned above, the substrate and the electronic part are bonded together, and the electrode of the substrate and the stud bumps of the electronic part are electrically connected.

Since the method for producing a bonded structure of the present invention uses the insulating resin film of the present invention, flowing of the stud bumps is prevented, and a bonded structure having excellent adherence (die shear strength) even after the PCT, and excellent connection reliability can be efficiently produced.

EXAMPLES

The present invention will be more specifically explained with reference to Examples and Comparative Examples hereinafter, but these Examples shall not be construed as to limit the scope of the invention in any way.

—Preparation of Adhesive Layer Coating Liquid—

Adhesive layer coating liquids were each prepared by uniformly mixing each material depicted in Table 1 in the amount (parts by mass) depicted in Table 1, in a 1/1 mixed solution of toluene and ethyl acetate.

TABLE 1

| Adhesive layer coating liquid | | A layer (parts by mass) | B layer (1) (with silica) (parts by mass) | B layer (without silica) (parts by mass) |
|---|---|---|---|---|
| Epoxy resin | HP4032D | 15 | — | — |
|  | EP828 | — | 10 | 10 |
|  | HP7200H | — | 5 | 5 |
| Curing agent | Novacure 3941HP | 15 | 20 | 20 |
| Organic resin to be high polymer component | YP50 | 10 | 10 | 10 |
| Stress relaxant | PKB1003 | 5 | 5 | 5 |
| Inorganic filler | SOE2 | 50 | 50 | — |
| Coupling agent | A-187 | 1 | 1 | 1 |

| Adhesive layer coating liquid | | B layer (2) (with silica) (parts by mass) | C layer (intermediate layer) (parts by mass) |
|---|---|---|---|
| Epoxy resin | HP4032D | — | — |
|  | EP828 | 10 | 10 |
|  | HP7200H | 5 | 5 |
| Curing agent | Novacure 3941HP | 20 | 20 |
| Organic resin to be high polymer component | YP50 | 10 | 10 |
| Stress relaxant | PKB1003 | 5 | 5 |
| Inorganic filler | SOE2 | 75 | 60 |
| Coupling agent | A-187 | 1 | 1 |

In Table 1, for the epoxy resin, the product name "HP4032D" is a naphthalene epoxy resin manufactured by DIC Corporation, the product name "EP828" is a bisphenol A epoxy resin manufactured by Japan Epoxy Resins Co., Ltd., and the product name "HP7200H" is a dicyclopentadiene epoxy resin manufactured by DIC Corporation.

For the curing agent, the product name "Novacure 3941HP" is a microcapsulated-amine epoxy curing agent, in which the amine curing agent is microcapsulated, manufactured by Asahi Kasei Chemicals Corporation.

For the organic resin to be a high polymer component, the product name "YP50" is a bisphenol A phenoxy resin manufactured by Tohto Kasei Co., and the product name "PKB1003" as the stress relaxant is a rubber-modified epoxy resin manufactured by KUREHA TRADING Co., Ltd.

For the inorganic filler, the product name "SOE2" is fused silica manufactured by Admatechs Company Limited.

For a coupling agent, the product name "A-187" is a silane coupling agent containing an epoxy group, manufactured by Momentive Performance Materials.

Comparative Production Example 1

—Preparation of Insulating Resin Film Consisting Only of A Layer—

The A layer coating liquid having the formulation depicted in Table 1 was applied on a release film by a bar coater, and the applied liquid was heated in an oven at 70° C. for 5 minutes to dry out the organic solvent therein, to thereby prepare an insulating resin film having a thickness of 50 μm.

Comparative Production Example 2

—Preparation of Insulating Resin Film Consisting Only of B Layer (1) (with Silica)—

The B layer coating liquid (1) (with silica) having the formulation depicted in Table 1 was applied on a release film by a bar coater, and the applied liquid was heated in an oven at 70° C. for 5 minutes to dry out the organic solvent therein, to thereby prepare an insulating resin film having a thickness of 50 μm.

Production Example 1

—Preparation of Insulating Resin Film Having Two-Layer Structure—

The A layer coating liquid having the formulation depicted in Table 1 was applied on a release film by a bar coater, and the applied liquid was heated in an oven at 70° C. for 5 minutes to dry out the organic solvent therein, to thereby form an A layer having a thickness of 25 μm.

The B layer coating liquid (1) (with silica) having the formulation depicted in Table 1 was applied on a release film by a bar coater, and the applied liquid was heated in an oven at 70° C. for 5 minutes to dry out the organic solvent therein, to thereby form a B layer (1) (with silica) having a thickness of 25 μm.

The previously prepared A layer and B layer (1) (with silica) were bonded together by laminating, to thereby prepare an insulating resin film having a total thickness of 50 μm.

Production Example 2

—Preparation of Insulating Resin Film Having Two-Layer Structure—

An insulating resin film having a total thickness of 50 μm was prepared in the same manner as in Production Example 1, provided that the thickness of A layer, and the thickness of B layer (with silica) (1) were changed to 40 μm, and 10 μm, respectively.

Comparative Production Example 3

—Preparation of Insulation Resin Film Having Two-Layer Structure—

The A layer coating liquid having the formulation depicted in Table 1 was applied on a release film by a bar coater, and the applied liquid was heated in an oven at 70° C. for 5 minutes to dry out the organic solvent therein, to thereby form an A layer having a thickness of 40 μm.

The B layer coating liquid (without silica) having the formulation depicted in Table 1 was applied on a release film by a bar coater, and the applied liquid was heated in an oven at 70° C. for 5 minutes to dry out the organic solvent therein, to thereby form a B layer (without silica) having a thickness of 10 μm.

The previously prepared A layer and B layer (without silica) were bonded together by laminating, to thereby prepare an insulating resin film having a total thickness of 50 μm.

Comparative Production Example 4

—Preparation of Insulating Resin Film Having Two-Layer Structure—

It was attempted to produce an insulating resin film in the same manner as in Production Example 1, provided that a thickness of the A layer was changed to 47 μm, and a thickness of the B layer (1) (with silica) was changed to 3 μm, but the coating film (i.e. B layer (1) (with silica)) having a thickness of 3 μm could not be produced with desirable reproducibility.

Comparative Production Example 5

—Preparation of Insulating Resin Film Having Two-Layer Structure—

An insulating resin film having a total thickness of 50 μm was prepared in the same manner as in Production Example 1, provided that the thickness of A layer, and the thickness of B layer (1) (with silica) were changed to 10 μm, and 40 μm, respectively.

Comparative Production Example 6

—Preparation of Insulating Resin Film Having Two-Layer Structure Containing Identical Resins—

The B layer coating liquid (1) (with silica) having the formulation depicted in Table 1 was applied on a release film by a bar coater, and the applied liquid was heated in an oven at 70° C. for 5 minutes to dry out the organic solvent therein, to thereby form a B layer (1) (with silica) having a thickness of 25 μm.

The B layer coating liquid (without silica) having the formulation depicted in Table 1 was applied on a release film by a bar coater, and the applied liquid was heated in an oven at 70° C. for 5 minutes to dry out the organic solvent therein, to thereby form a B layer (without silica) having a thickness of 25 μm.

The previously prepared B layer (with silica) and B layer (without silica) were bonded together by laminating, to thereby prepare an insulating resin film having a total thickness of 50 μm.

The obtained insulating resin film consisted of two layers both containing the identical resins, and had a structure where one layer contained the inorganic filler, and the other layer contained no inorganic filler.

Comparative Production Example 7

—Preparation of Insulating Resin Film Consisting Only of B Layer (2) (with Silica)—

The B layer coating liquid (2) (with silica) having the formulation depicted in Table 1 was applied on a release film by a bar coater, and the applied liquid was heated in an oven at 70° C. for 5 minutes to dry out the organic solvent therein, to thereby prepare an insulating resin film having a thickness of 50 μm.

Comparative Production Example 8

—Preparation of Insulating Resin Film Consisting Only of C Layer (Intermediate Layer)—

The C layer (intermediate layer) coating liquid having the formulation depicted in Table 1 was applied on a release film by a bar coater, and the applied liquid was heated in an oven at 70° C. for 5 minutes to dry out the organic solvent therein, to thereby prepare an insulating resin film having a thickness of 50 μm.

Production Example 3

—Preparation of Insulating Resin Film Having Two-Layer Structure—

The A layer coating liquid having the formulation depicted in Table 1 was applied on a release film by a bar coater, and the applied liquid was heated in an oven at 70° C. for 5 minutes to dry out the organic solvent therein, to thereby form an A layer having a thickness of 25 μm.

The B layer coating liquid (2) (with silica) having the formulation depicted in Table 1 was applied on a release film by a bar coater, and the applied liquid was heated in an oven at 70° C. for 5 minutes to dry out the organic solvent therein, to thereby form a B layer (2) (with silica) having a thickness of 25 μm.

The previously prepared A layer and B layer (2) (with silica) were bonded together by laminating, to thereby prepare an insulating resin film having a total thickness of 50 μm.

Production Example 4

—Preparation of Insulating Resin Film Having Three-Layer Structure—

The A layer coating liquid having the formulation depicted in Table 1 was applied on a release film by a bar coater, and the applied liquid was heated in an oven at 70° C. for 5 minutes to dry out the organic solvent therein, to thereby form an A layer having a thickness of 25 μm.

The C layer (intermediate layer) coating liquid having the formulation depicted in Table 1 was applied on a release film by a bar coater, and the applied liquid was heated in an oven at 70° C. for 5 minutes to dry out the organic solvent therein, to thereby form a C layer (an intermediate layer) having a thickness of 10 μm.

The B layer coating liquid (2) (with silica) having the formulation depicted in Table 1 was applied on a release film by a bar coater, and the applied liquid was heated in an oven at 70° C. for 5 minutes to dry out the organic solvent therein, to thereby form a B layer (2) (with silica) having a thickness of 15 μm.

The previously prepared A layer, C layer (intermediate layer), B layer (2) (with silica) were bonded together in this order by laminating, to thereby prepare an insulating resin film having a total thickness of 50 μm.

Each of the obtained insulating resin films was subjected to the measurements of the glass transition temperature, DSC exothermic peak temperature, linear expansion coefficients α1 and α2, and cure shrinkage. The results are depicted in Tables 2 to 4.

[Glass Transition Temperature]

From each of the prepared insulating resin films, a completely cured sample was prepared by hot pressing the film at 180° C. for 30 minutes, and the obtained sample was cut into a test piece having a length of 50 mm, width of 5 mm, and height of 0.05 mm. The glass transition temperature of the prepared test piece was measured in accordance with JIS K7244.

[DSC Exothermic Peak Temperature]

The DSC exothermic peak temperature was measured by means of a differential scanning calorimeter (EXSTAR6000, manufactured by Seiko Instruments Inc.).

[Linear Expansion Coefficients α1 and α2]

From each of the prepared insulating resin films, a completely cured sample was prepared by hot pressing the film at 180° C. for 30 minutes, and the obtained sample was cut into a cylindrical test piece having a length of 15 mm, and diameter of 5 mm. The linear expansion coefficients α1 and α2 of the test piece were measured in accordance with JIS K7197.

[Cure Shrinkage]

The cure shrinkage was measured by using a pycnometer and measuring a density of the uncured sample and a density of cured sample.

Example 1

—Production of Bonded Structure—

A bonding of a substrate (PCB) and an electronic part (an IC chip) was performed using the insulating resin film obtained in Production Example 1.

As for evaluation materials, a substrate for evaluation (a glass epoxy substrate, MCL-E-679 LD, manufactured by Hitachi Chemical Company, Ltd., having a thickness of 0.6 mm), and an IC chip for evaluation (manufactured by Sony Chemical & Information Device Corporation, having a size of 6.3 mm×6.3 mm, and thickness of 0.4 mm, with Au stud bumps having a pitch of 150 μm, passivation PID) were prepared.

<Bonding Step>

The insulating resin film was arranged so that the A layer was provided at the side of the substrate, and the B layer (1) (with silica) was provided at the side of the IC chip, and the IC chip and the substrate were bonded together by heating at 180° C., for 20 seconds, and pressing at 10 kgf/IC, to thereby obtain a bonded structure.

Example 2

—Production of Bonded Structure—

A bonded structure was produced in the same manner as in Example 1, provided that the insulating resin film of Production Example 1 was replaced with the insulating resin film of Production Example 2.

Comparative Example 1

—Production of Bonded Structure—

A bonded structure was produced in the same manner as in Example 1, provided that the insulating film of Production Example 1 was replaced with the insulating resin film of Comparative Production Example 1.

Comparative Example 2

—Production of Bonded Structure—

A bonded structure was produced in the same manner as in Example 1, provided that the insulating film of Production Example 1 was replaced with the insulating resin film of Comparative Production Example 2.

Comparative Example 3

—Production of Bonded Structure—

A bonded structure was produced in the same manner as in Example 1, provided that the insulating resin film was arranged so that the A layer was provided at the side of the IC chip, and the B layer (1) (with silica) was provided at the side of the substrate.

Comparative Example 4

—Production of Bonded Structure—

A bonded structure was produced in the same manner as in Example 1, provided that the insulating film of Production Example 1 was replaced with the insulating resin film of Comparative Production Example 3.

Comparative Example 5

—Production of Bonded Structure—

It was attempted to produce a bonded structure in the same manner as in Example 1, provided that the insulating resin film of Production Example 1 was replaced with the insulating resin film of Comparative Production Example 4, and to perform thermocompression. As mentioned earlier, however, the coating film (B layer (1) (with silica)) having a thickness of 3 μm could not be produced with the desirable reproducibility in Comparative Production Example 4. Therefore, a bonded structure could not be attained.

Comparative Example 6

—Production of Bonded Structure—

A bonded structure was produced in the same manner as in Example 1, provided that the insulating film of Production Example 1 was replaced with the insulating resin film of Comparative Production Example 5.

Comparative Example 7

—Production of Bonded Structure—

A bonded structure was produced in the same manner as in Example 1, provided that the insulating resin film of Production Example 1 was replaced with the insulating resin film of Comparative Production Example 6, and the insulating resin film was arranged so that the B layer (1) (with silica) was provided at the side of the substrate, and the B layer (without silica) was provided at the side of the IC chip.

Comparative Example 8

—Production of Bonded Structure—

A bonded structure was produced in the same manner as in Example 1, provided that the insulating film of Production Example 1 was replaced with the insulating resin film of Comparative Production Example 7.

Example 3

—Production of Bonded Structure—

A bonded structure was produced in the same manner as in Example 1, provided that the insulating resin film of Production Example 1 was replaced with the insulating resin film of Production Example 3, and the insulating resin film was arranged so that the A layer was provided at the side of the substrate, and the B layer (2) (with silica) was provided at the side of the IC chip.

Example 4

—Production of Bonded Structure—

A bonded structure was produced in the same manner as in Example 1, provided that the insulating resin film of Production Example 1 was replaced with the insulating resin film of Production Example 4, and the insulating resin film was arranged so that the A layer was provided at the side of the substrate, and the B layer (2) (with silica) was provided at the side of the IC chip.

Each of the obtained bonded structures was subjected to the measurements of connection resistance and die shear strength, as well as to the appearance evaluation. The results are depicted in Tables 2 to 4.

[Connection Resistance]

The connection resistance of each bonded structure was measured by a tester at the initial stage, after moisture/reflow sensitivity test, and after a pressure cooker test (PCT).

The moisture/reflow sensitivity test was performed, after pretreating the sample for 24 hours at 85° C. and 85% RH to absorb the moisture, passed through a reflow oven (top temperature: 260° C.) three times.

The PCT was performed by aging the sample for 96 hours in the saturated atmosphere of 121° C., and 2 atm.

[Die Shear Strength]

The die shear strength was measured in the following manner. A sample was prepared by thermocompression bonding the IC chip and the substrate with each of the insulating resin films in the shape of 1.5 mm by 1.5 mm square. The prepared sample was subjected to the measurement of die shear strength with a testing speed of 200 μm/s at an initial stage, and after the PCT. From the measured values, a maintaining rate was calculated.

The PCT was performed by aging the sample for 20 hours in the saturated atmosphere of 121° C., and 2 atm.

[Appearance Evaluation]

The appearance evaluation was performed by visually observing a cross section of the insulating resin film part of each of the bonded structures, and rating based on the following evaluation criteria.

—Evaluation Criteria—

Figure 2A:
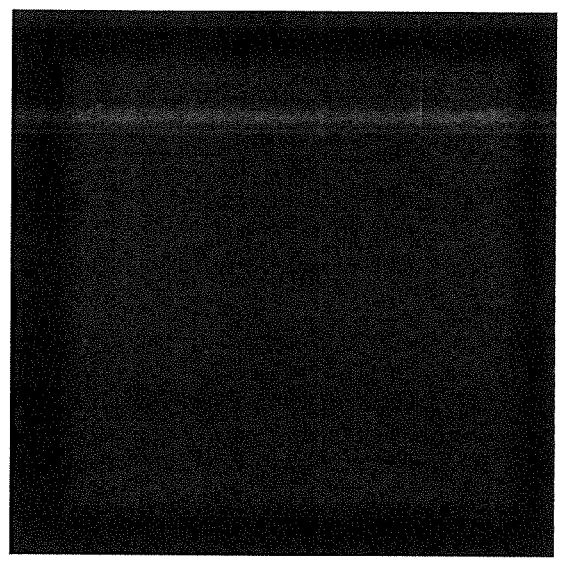
FIG. 2A is a photograph illustrating a state "A" in the appearance evaluation.

A: As illustrated in FIG. 2A, no void was observed.

Figure 2B:
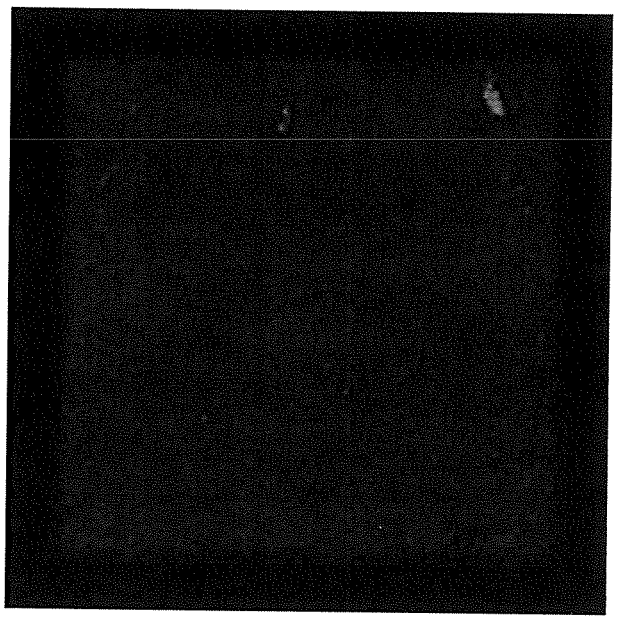
FIG. 2B is a photograph illustrating a state "B" in the appearance evaluation.

B: As illustrated in FIG. 2B, some voids were observed at part of the cross-sectional surface.

Figure 2C:
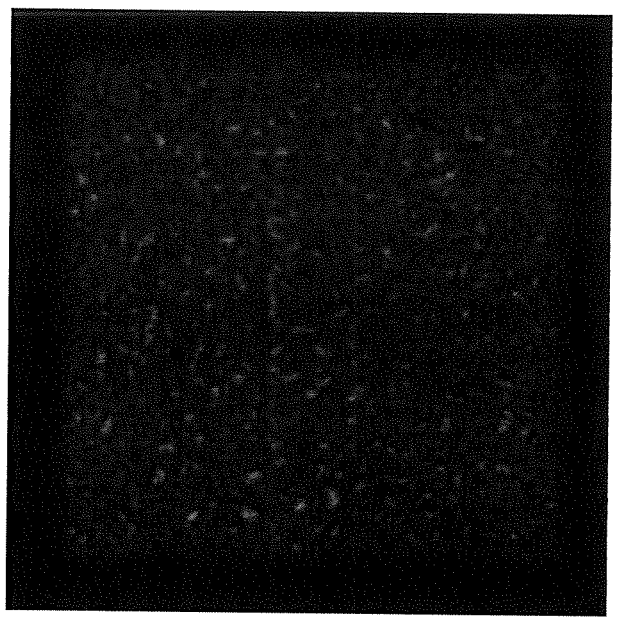
FIG. 2C is a photograph illustrating a state "C" in the appearance evaluation.

C: As illustrated in FIG. 2C, voids were observed on the entire cross-sectional surface.

TABLE 2

|  |  |  | Comp. Ex. 1 | Comp. Ex. 2 | Ex. 1 | Ex. 2 |
|---|---|---|---|---|---|---|
| Insulating resin film | Layer structure | IC side | A layer | B layer(1) (with silica) | B layer (1) (with silica) A layer | B layer(1) (with silica) A layer |
|  |  | PCB side |  |  |  |  |
|  | Total thickness (μm) |  | 50 | | | 50 |
|  | Thickness of IC side (μm) |  | — | — | 25 | 10 |
|  | Thickness of PCB side (μm) |  | — | — | 25 | 40 |
|  | Rate of thickness of PCB side (%) |  | — | — | 50 | 80 |
|  | Tg (° C.) |  | 160 | 144 | 148 | 154 |
|  | DSC exothermic peak (° C.) |  | 116.5 | 126 | 121 | 118 |
|  | Difference in DSC exothermic peak (° C.) |  | — | — | 9.5 | 9.5 |
|  | Linear expansion coefficient α1 (ppm/° C.) |  | 34 | 34 | — | — |
|  | Absolute value of the difference in α1 |  | — | — | 0 | 0 |
|  | Linear expansion coefficient α2 (ppm/° C.) |  | 118 | 130 | — | — |
|  | Absolute value of the difference in α2 |  | — | — | 12 | 12 |
|  | Cure shrinkage (%) |  | 5.5 | 3.6 | — | — |
| Connection resistance (Ω) | Initial |  | 0.02 or lower | 0.02 or lower | 0.02 or lower | 0.02 or lower |
|  | After moisture/reflow |  | 0.02 or lower | 0.02 or lower | 0.02 or lower | 0.02 or lower |
|  | After PCT |  | 0.1 | 1 or higher | 0.02 or lower | 0.02 or lower |
| Die shear strength (kgf/mm$^2$) | Initial |  | 5.6 | 5.0 | 5.1 | 5.1 |
|  | After PCT |  | 2.4 | 4.1 | 4.2 | 4.4 |
|  | Maintaining rate (%) |  | 43 | 82 | 82 | 86 |
| Appearance (void) evaluation |  |  | B | C | A | A |

TABLE 3

|  |  |  | Comp. Ex. 3 | Comp. Ex. 4 | Comp. Ex. 5 | Comp. Ex. 6 | Comp. Ex. 7 |
|---|---|---|---|---|---|---|---|
| Insulating resin film | Layer structure | IC side | A layer | B layer (without silica) | B layer(1) (with silica) | B layer(1) (with silica) | B layer (without silica) |
|  |  | PCB side | B layer(1) (with silica) | A layer | A layer | A layer | B layer(1) (with silica) |
|  | Total thickness (μm) |  |  |  | 50 |  |  |
|  | Thickness of IC side (μm) |  | 25 | 10 | 3 | 40 | 25 |
|  | Thickness of PCB side (μm) |  | 25 | 40 | 47 | 10 | 25 |
|  | Rate of thickness of PCB side (%) |  | 50 | 80 | 94 | 20 | 50 |
|  | Tg (° C.) |  | 148 | 154 | — | 145 | 144 |
|  | DSC exothermic peak (° C.) |  | 121 | 118 | — | 123 | 126 |
|  | Difference in DSC exothermic peak (° C.) |  | 9.5 | 9.5 | 9.5 | 9.5 | — |
|  | Linear expansion coefficient α1 (ppm/° C.) |  | — | — | — | — | — |
|  | Absolute value of the difference in α1 |  | 0 | 36 | 0 | 0 | 36 |
|  | Linear expansion coefficient α2 (ppm/° C.) |  | — | — | — | — | — |
|  | Absolute value of the difference in α2 |  | 12 | 72 | 12 | 12 | 65 |
|  | Cure shrinkage (%) |  | — | — | — | — | — |
| Connection resistance (Ω) | Initial |  | 0.02 or lower | 0.02 or lower | Could not be produced | 0.02 or lower | 0.02 or lower |
|  | After moisture/reflow |  | 0.02 or lower | 0.02 or lower |  | 0.02 or lower | 0.02 or lower |
|  | After PCT |  | 0.1 | 1 or higher |  | 1 or higher | 1 or higher |

TABLE 3-continued

|  |  | Comp. Ex. 3 | Comp. Ex. 4 | Comp. Ex. 5 | Comp. Ex. 6 | Comp. Ex. 7 |
|---|---|---|---|---|---|---|
| Die shear strength (kgf/mm$^2$) | Initial | 5.5 | 5.0 |  | 5.0 | 5.0 |
|  | After PCT | 3.3 | 4.1 |  | 4.1 | 4.0 |
|  | Maintaining rate (%) | 60 | 65 |  | 80 | 80 |
| Appearance (void) evaluation |  | B | C |  | C | C |

TABLE 4

|  |  |  | Comp. Ex. 8 | Ex. 3 | Ex. 4 |
|---|---|---|---|---|---|
| Insulating resin film | Layer structure | IC side | B layer (2) (with silica) | B layer (2) (with silica) | B layer (2) (with silica) |
|  |  | Intermediate | — | — | C layer |
|  |  | PCB side |  | A layer | A layer |
|  | Total thickness (μm) |  | 50 | 50 | 50 |
|  | Thickness of IC side (μm) |  | — | 25 | 15 (intermediate layer: 10) |
|  | Thickness of PCB side (μm) |  | — | 25 | 25 |
|  | Rate of thickness of PCB side (%) |  | — | 50 | 50 |
|  | Tg (° C.) |  | 144 | 148 | 148 |
|  | DSC exothermic peak (° C.) |  | 126 | 121 | 121 |
|  | Difference in DSC exothermic peak (° C.) |  | — | 9.5 | 9.5 |
|  | Linear expansion coefficient α1 (ppm/° C.) |  | 25 | — | — |
|  | Absolute value of the difference in α1 |  | — | 9 | 9 |
|  | Linear expansion coefficient α2 (ppm/° C.) |  | 100 | — | — |
|  | Absolute value of the difference in α2 |  | — | 18 | 18 |
|  | Cure shrinkage (%) |  | 3.5 | — | — |
| Connection resistance (Ω) | Initial |  | 0.02 or lower | 0.02 or lower | 0.02 or lower |
|  | After moisture/reflow |  | 0.02 or lower | 0.02 or lower | 0.02 or lower |
|  | After PCT |  | 1 or higher | 0.02 or lower | 0.02 or lower |
| Die shear strength (kgf/mm$^2$) | Initial |  | 5.0 | 5.0 | 5.1 |
|  | After PCT |  | 4.0 | 4.1 | 4.0 |
|  | Maintaining rate (%) |  | 80 | 82 | 80 |
| Appearance (void) evaluation |  |  | C | A | A |

From the results depicted in Tables 2 to 4, the bonded structures of Examples 1 to 4 had no voids, and had excellent connection reliability and excellent maintaining rate of the die shear strength after the PCT. Especially, the bonded structure of Example 2, which had higher proportion of the thickness of A layer arranged at the side of the substrate (PCB) had the improved maintaining rate of the die shear strength compared to the bonded structure of Example 1.

The bonded structures of Comparative Examples 1 and 2 used the insulating resin film only consisted of A layer or B layer (1) (with silica), the formations of voids were observed, and the connection resistance thereof was worsened after the PCT.

The bonded structure of Comparative Example 3 had the A layer, which had high curing speed, at the side of the IC chip, and the B layer (1) (with silica), which had slow curing speed, at the side of the substrate, the formations of voids were observed, the connection resistance thereof was worsened after the PCT, and it had low die shear strength.

The bonded structure of Comparative Example 4 did not include the inorganic filler in the B layer, and therefore voids were observed on the entire surface, and the connection reliability thereof was low because of low dimensional stability.

The bonded structure of Comparative Example 5 had the B layer, the thickness of which was too thin, at the side of the IC chip, and therefore the insulating resin film itself could not be produced with desirable reproducibility. The bonded structure of Comparative Example 6 had the A layer, the thickness of which was too thin, at the side of the substrate, and therefore, voids were observed on the entire surface, and the connection resistance was poor after the PCT because the glass transition temperature of the adhesive layer at the connection part with the bump was low.

The bonded structure of Comparative Example 7 had two layers including the identical resins as base materials, and having no inorganic filler, and therefore voids were observed on the entire surface, and the connection reliability thereof after the PCT was low because of the low dimensional stability.

The bonded structure of Comparative Example 8 used the insulating resin film having the single layer structure, consisted only of the B layer (2) (with silica), and therefore voids were observed, and the connection resistance thereof was poor after the PCT.

The insulating resin film of the present invention prevents occurrences of voids, provide sufficient adherence to an electronic part and to a substrate, and gives excellent connection reliability, and hence it is suitably used for bonding various electronic parts with a substrate, particularly suitably used as a non-conductive film (NCF) for chip on board (COB) bonding.

The bonded structure of the present invention has sufficient adherence (die shear strength) even after PCT, and has excellent connection reliability.

The method for producing a bonded structure of the present invention can efficiently produce the bonded structure of the present invention.

What is claimed is:

1. A method for producing a bonded structure, comprising:
arranging a substrate containing an electrode, an electronic part containing stud bumps, and an insulating resin film so that the electrode of the substrate and the stud bumps of the electronic parts are faced each other via the insulating resin film, and heating and pressing the substrate and the electronic part to thereby bond the substrate and the electronic part together,
wherein the insulating resin film contains:
a first adhesive layer; and
a second adhesive layer,
wherein the insulating resin film is configured to bond the substrate and the electronic part together, and the first adhesive layer is provided at a side of the substrate and the second adhesive layer is provided at a side of the electronic part,
wherein the first adhesive layer and the second adhesive layer each contain inorganic filler,
wherein the second adhesive layer has a differential scanning calorimetry (DSC) exothermic peak temperature that is higher than a DSC exothermic peak temperature of the first adhesive layer,
wherein the first adhesive layer has a thickness that is 50% to 90% of a total thickness of the insulating resin film,
wherein the first adhesive layer contains an epoxy resin and the second adhesive layer contains an epoxy resin,
wherein the epoxy resin in the first adhesive layer is different from the epoxy resin in the second adhesive layer;
wherein the first adhesive layer contains an inorganic filler and the inorganic filler in the first adhesive layer is silica and the second adhesive layer contains an inorganic filler and the inorganic filler in the second adhesive layer is silica, and wherein the silica in the first adhesive layer is the same as the silica in the second adhesive layer;
wherein the difference between the DSC exothermic peak temperature of the first adhesive layer and the DSC exothermic peak temperature of the second adhesive layer is 7° C. to 9.5° C., and
wherein the DSC exothermic peak temperature of the first adhesive layer is 115.5° C. to 118° C.;
wherein the DSC exothermic peak of the second adhesive layer is 125° C. to 127.5° C.

2. The method for producing a bonded structure according to claim 1, further comprising an intermediate layer provided between the first adhesive layer and the second adhesive layer.

3. The method for producing a bonded structure according to claim 1, wherein the first adhesive layer has a glass transition temperature that is higher than a glass transition temperature of the second adhesive layer.

4. The method for producing a bonded structure according to claim 1, wherein a difference in linear expansion coefficient $\alpha 1$ between the first adhesive layer and the second adhesive layer is smaller than 10 in an absolute value, and a difference in linear expansion coefficient $\alpha 2$ between the first adhesive layer and the second adhesive layer is smaller than 30 in an absolute value.

5. The method for producing a bonded structure according to claim 1, wherein the DSC exothermic peak temperature of the insulating resin film in the state where the first adhesive layer and the second adhesive layer are laminated is 118° C. to 125° C.

* * * * *